US009869691B2

(12) United States Patent
Boisseau et al.

(10) Patent No.: US 9,869,691 B2
(45) Date of Patent: Jan. 16, 2018

(54) SPRING-MASS SYSTEM WITH A SMALL TRANSVERSE DISPLACEMENT

(71) Applicant: Commissariat a L'Energie Atomique et aux Energies Alternatives, Paris (FR)

(72) Inventors: Sebastien Boisseau, Grenoble (FR); Jean-Jacques Chaillout, Saint-Etienne-de-Crossey (FR); Ghislain Despesse, Grenoble (FR); Alexandre-Benoit Duret, Saujon (FR)

(73) Assignee: Commissariat a L'Energie Atomique et aux Energies Alternatives, Paris (FR)

( * ) Notice: Subject to any disclaimer, the term of this patent is extended or adjusted under 35 U.S.C. 154(b) by 647 days.

(21) Appl. No.: 14/557,614

(22) Filed: Dec. 2, 2014

(65) Prior Publication Data

US 2015/0153377 A1 Jun. 4, 2015

(30) Foreign Application Priority Data

Dec. 2, 2013 (FR) ...................................... 1361914

(51) Int. Cl.
*G01P 15/08* (2006.01)
*B81B 3/00* (2006.01)
(Continued)

(52) U.S. Cl.
CPC .......... *G01P 15/0802* (2013.01); *B81B 3/007* (2013.01); *B81B 3/0021* (2013.01); *B81B 3/0037* (2013.01); *F03G 3/00* (2013.01); *G01C 9/00* (2013.01); *G01D 5/12* (2013.01); *B81B 2203/0109* (2013.01); *B81B 2203/0163* (2013.01); *H01L 27/16* (2013.01)

(58) Field of Classification Search
CPC ........................................................ H01L 27/16
USPC ........................................................ 257/418
See application file for complete search history.

(56) References Cited

U.S. PATENT DOCUMENTS

| 5,604,313 A * | 2/1997 | Cahill | G01P 15/0802 |
| | | | 257/415 |
| 6,843,127 B1 * | 1/2005 | Chiou | G01C 19/5719 |
| | | | 73/504.12 |

(Continued)

OTHER PUBLICATIONS

Search Report issued in French Application No. 13/61914 dated May 21, 2014.
(Continued)

*Primary Examiner* — Chandra Chaudhari
(74) *Attorney, Agent, or Firm* — Moreno IP Law LLC

(57) ABSTRACT

A spring-mass system including a support, a mass mobile with respect to the support, at least one first and one second spring connecting the mass to the support allowing a displacement of the mass relative to the support along a first direction, the first spring being the symmetrical of the second spring with respect to an axis, each first and second spring comprising at least first and second series-connected beams arranged in zigzag, and a first closed frame surrounding the mass, at a distance from the mass and the support, each first beam having a first end connected to the support and a second end attached to the first frame and each second beam having a third end attached to the first frame and a fourth end connected to the mass.

17 Claims, 3 Drawing Sheets

(51) Int. Cl.
    *F03G 3/00*         (2006.01)
    *G01C 9/00*         (2006.01)
    *G01D 5/12*         (2006.01)
    *H01L 27/16*       (2006.01)

(56) References Cited

U.S. PATENT DOCUMENTS 7,617,729 B2 * 11/2009 Axelrod ................ G01P 15/125
                                                                             73/514.32
2012/0320439 A1    12/2012 Hiraoka et al.

OTHER PUBLICATIONS

"Micro Thermal Switch With Stiffness Enhanced Thermal Isolation Structure", T. Tsukamoto, Department of Nanomechanics and Advanced Institute for Materials Research, Tohoku University, Sendai, Japan, 4 pages, (no date).

"Innovative Structure for Mechanical Energy Scavenging", G. Despesse, et al., 4 pages, (2007).

IOP Science—"A Batch-Fabricated and Electret-Free Silicon Electrostatic Vibration Energy Harvester", P. Basset, et al., 13 pages, (2009).

"A 2-DOF Wideband Electrostatic Transducer for Energy Harvesting and Implantable Applications", Zhu, et al., School of Electrical Engineering and Computer Science, the University of New Castle, 4 pages, (2009).

* cited by examiner

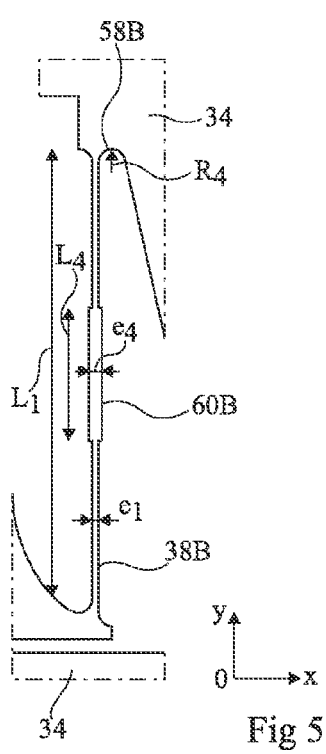
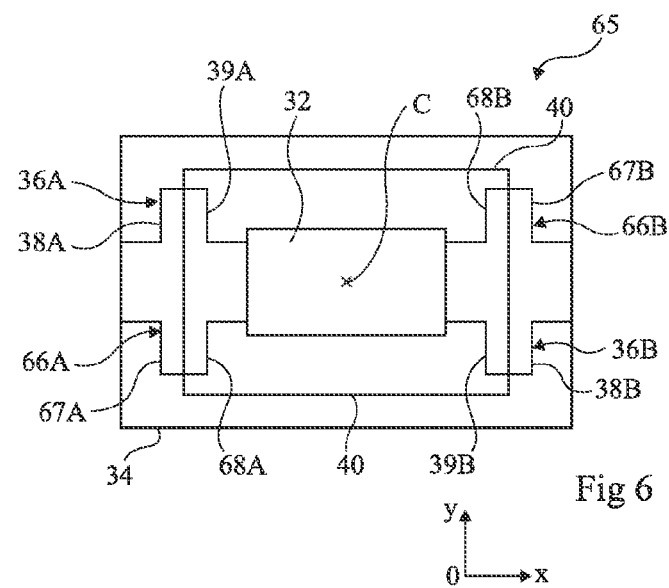
Fig 5
Fig 6
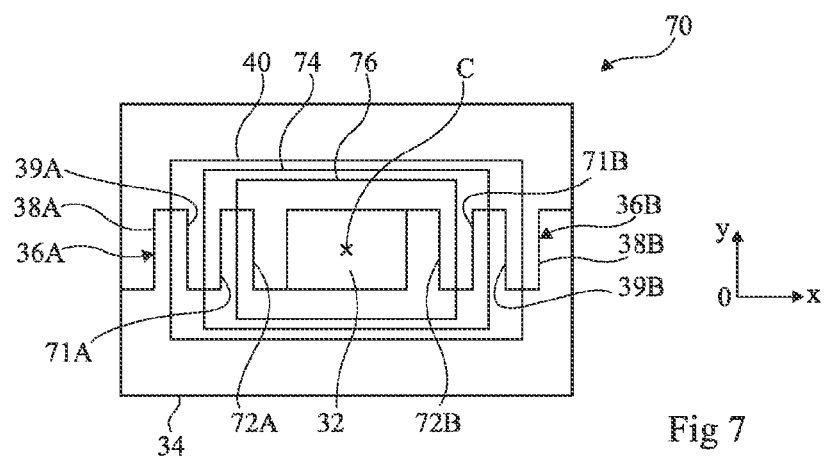
Fig 7
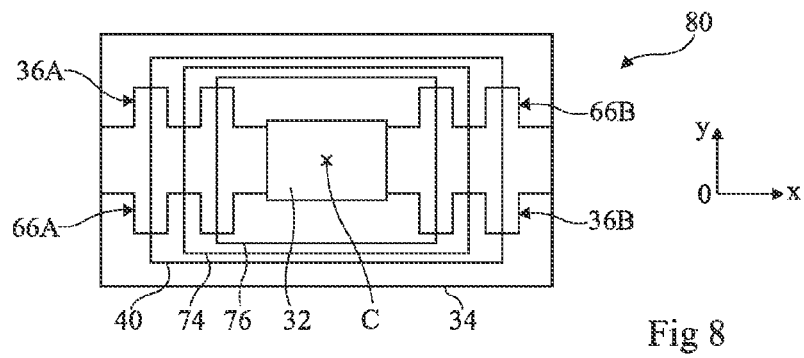
Fig 8

SPRING-MASS SYSTEM WITH A SMALL TRANSVERSE DISPLACEMENT

FIELD

The present disclosure relates to a spring-mass system, particularly a spring-mass system having a resonance frequency smaller than 50 Hz.

BACKGROUND

Spring-mass systems may be used for many applications, particularly to form an energy recovery device, an accelerometer, an inclinometer, a seismometer, etc.

FIG. 1 is a partial simplified lateral view of an example of an energy recovery device 10 using a microelectromechanical system or MEMS. It for example is a vibration energy recovery device 10 with an electret-based electrostatic converter. Such vibration energy recovery devices particularly aim at converting the ambient vibrations into electricity, particularly to power low power consumption systems, for example, self-contained sensors or pacemakers. Device 10 comprises a plate 12, for example, made of a dielectric material, particularly glass, and a spring-mass system 14 mounted on plate 12. Spring-mass system 14 comprises a mass 18 mobile with respect to plate 12 and connected by springs 20 to an element 16 which is fixed with respect to plate 12. Springs 20 allow a displacement of mobile mass 18 relative to plate 12 along a direction (Ox), which is generally horizontal. Call direction (Oz) the direction perpendicular to direction (Ox) and to the surface of plate 12 supporting electrodes 26. Direction (Oz) generally corresponds to the vertical direction.

Spring-mass system 14 may be partly formed by etching of a plate of a semiconductor material, particularly silicon. In this case, mobile mass 18 may comprise a portion 22 of the silicon plate and an additional mass 24 attached to portion 22. Each spring 20 may comprise series-connected rectilinear beams arranged in zigzag.

Electrodes 26 are provided on lower plate 12 opposite mobile portion 22. Electrets 28 may be arranged on the surface of mobile portion 22 opposite electrodes 26. Electrodes 26, mobile semiconductor material portion 22, and electrets 28 form an electret-based electrostatic converter. When vibrations are applied to device 10, spring-mass system 14 converts these vibrations into an alternating motion of mobile mass 18 along direction (Ox). The relative motion between mobile portion 22 and plate 12 causes the flowing of an electric current in a load resistor placed across the electrostatic converter.

For the proper operation of energy recovery device 10, electrodes 26 and electrets 28 should not come into contact with one another and, preferably, the distance between electrodes 26 and electrets 28 should remain substantially constant. This means that the displacement of the mobile mass along direction (Oz) should be as small as possible, in particular much smaller than the possible displacement along direction (Ox), for example according to a ratio 1/10 or 1/100. Further, for the power provided for each displacement by energy recovery device 10 to be as high as possible, the displacement of mobile mass 18 along direction (Ox) should be as high as possible.

To enable to efficiently recover the ambient vibrations, the resonance frequency of the spring-mass system should be substantially equal to the frequency of these vibrations. Ambient vibrations have a frequency which is generally lower than 50 Hz. Accordingly, it is desirable for the spring-mass system to have a low resonance frequency, smaller than 50 Hz, or even than 20 Hz. Such resonance frequencies are easy to obtain with conventional mechanical systems of large dimensions, particularly having a surface area greater than 3 cm$^2$ in a plane perpendicular to direction (Oz). Such resonance frequencies are much more difficult to obtain with MEMS structures made of silicon and having surface areas generally smaller than 3 cm$^2$. Indeed, such MEMS structures require using a mobile mass 18 having a weight which may be greater than one gram and beams forming springs 20 having a width smaller than 100 μm.

This may cause a sinking of mobile mass 18 along direction (Oz) under the effect of its own weight, which may be incompatible with the proper operation of device 10, particularly by the placing in contact of electrodes 26 with electrets 28.

SUMMARY

An embodiment overcomes all or part of the disadvantages of known spring-mass systems.

Another embodiment decreases the vertical displacement of the mobile mass of the spring-mass system.

Another embodiment increases the longitudinal displacement of the mobile mass of the spring-mass system.

Another embodiment provides a spring-mass system having a resonance frequency smaller than 50 Hz, or even than 20 Hz.

Another embodiment provides a spring-mass system capable of being used by a MEMS.

An embodiment provides a spring-mass system comprising:
a support;
a mass mobile with respect to the support;
at least one first and one second spring connecting the mass to the support and allowing a displacement of the mass relative to the support along a first direction, the first spring being the symmetrical of the second spring with respect to an axis, each first and second spring comprising at least first and second series-connected beams arranged in zigzag; and
a first closed frame surrounding the mass, at a distance from the mass and the support, each first beam having a first end connected to the support and a second end attached to the first frame, and each second beam having a third end attached to the first frame and a fourth end connected to the mass.

According to an embodiment, at least one of the first and second beams comprises a bulge in its median portion.

According to an embodiment, the length of each first and second beam is greater than or equal to 1 mm.

According to an embodiment, the height of each first and second beam measured parallel to the axis of symmetry is greater than or equal to 300 μm.

According to an embodiment, the width of each first and second beam measured perpendicularly to the length in a plane perpendicular to the axis of symmetry is smaller than or equal to 100 μm.

According to an embodiment, the first frame is connected to each first and second beam by a first rounded portion having a radius of curvature greater than or equal to ten times said length.

According to an embodiment, the second beam is connected to the mass by a second rounded portion having a radius of curvature greater than or equal to ten times said width.

According to an embodiment, the system comprises at least one third and one fourth spring connecting the mass to the support and allowing a displacement of the mass relative to the support along the first direction, the third spring being the symmetrical of the fourth spring with respect to said axis, each third and fourth spring comprising at least third and fourth series-connected beams arranged in zigzag, each third beam comprising a third end connected to the support and a fourth end attached to the first frame and each fourth beam comprising a fifth end attached to the first frame and a sixth end connected to the mass.

According to an embodiment, the system comprises, for each first and second spring, at least one fifth beam in series with the second beam and in zigzag with the second beam, and a second closed frame surrounding the mass, at a distance from the mass and the support, the fourth end of each second beam being attached to the second frame and each fifth beam comprising a seventh end attached to the second frame and an eighth end connected to the mass.

According to an embodiment, the system comprises, for each first and second spring, at least one sixth beam in series with the fifth beam and in zigzag with the fifth beam, and a third closed frame surrounding the mass, at a distance from the mass and the support, the eighth end of each fifth beam being attached to the third frame and each sixth beam comprising a ninth end attached to the third frame and a tenth end connected to the mass.

According to an embodiment, the first frame follows a closed curve selected from the group comprising a rectangle, a circle, an ellipse, and a closed broken line.

An embodiment provides an energy recovery device comprising a spring-mass system such as previously defined.

An embodiment provides a seismometer comprising a spring-mass system such as previously defined.

An embodiment provides an accelerometer comprising a spring-mass system such as previously defined.

An embodiment provides an inclinometer comprising a spring-mass system such as previously defined.

An embodiment provides a magnetometer comprising a spring-mass system such as previously defined, at least a portion of the mobile mass being made of a ferromagnetic material and/or of a permanent magnet.

An embodiment provides a force and/or displacement sensor comprising a spring-mass system such as previously defined.

The foregoing and other features and advantages of the present invention will be discussed in detail in the following non-limiting description of specific embodiments in connection with the accompanying drawings.

BRIEF DESCRIPTION OF THE DRAWINGS

FIG. 5 is a side detail view of FIG. 3; and

FIGS. 6 to 13 show functional diagrams of other embodiments of a spring-mass system.

DETAILED DESCRIPTION OF THE PRESENT EMBODIMENTS

Figure 1:
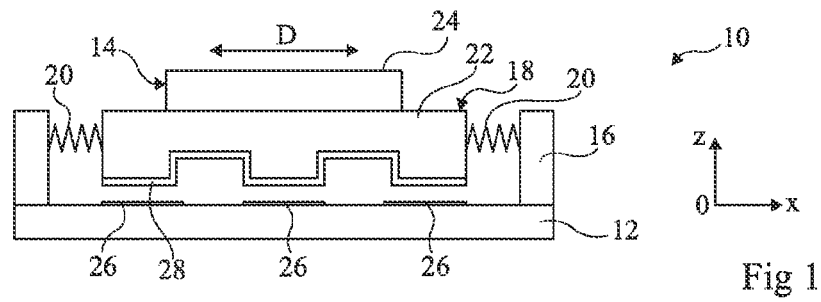
FIG. 1, previously defined, is a partial simplified lateral cross-section view of an example of an energy recovery device.

The same elements have been designated with the same reference numerals in the different drawings, which have been drawn out of scale. Further, only those elements which are useful to the understanding of the described embodiments have been shown and detailed. In particular, the devices using spring-mass systems have not been illustrated in detail, such devices being well known by those skilled in the art. Further, methods of MEMS manufacturing, particularly by etching of a silicon plate, are well known by those skilled in the art and will not be described in detail. Further, reference is made to positions (upper, lower lateral, etc.) arbitrarily based on the orientation of the drawings. Further, in the following description, expressions "substantially", "around", and "approximately" mean "to within 10%".

In the following description, embodiments of a spring-mass system adapted to the forming of a vibration energy recovery device will be described. However, the spring-mass system of the embodiments described hereafter may also be used for other applications, for example, to form an inclinometer, an accelerometer, or a seismometer, particularly enabling to detect motions, shocks, and vibrations at very low frequency or to measure very small inclinations, particularly relative to the plane perpendicular to the axis of gravity. The seismic mass may further be of permanent magnet type or made of ferric materials and may be likely to be submitted to forces as its approaches a magnetic field which is desired to be measured or from which power is desired to be collected. The spring-mass system may also be used as a force and/or displacement sensor. It may also be used as a weight sensor when it is inclined with respect to gravity or also as a sensor of the speed/flow of a fluid when it is attached to a protrusion which tends to be carried away by the fluid in direction (Ox). The force associated with the viscous friction of the protrusion in the liquid is then measured, after which, by modeling, the liquid flow velocity or the liquid flow rate is obtained.

Figure 2:
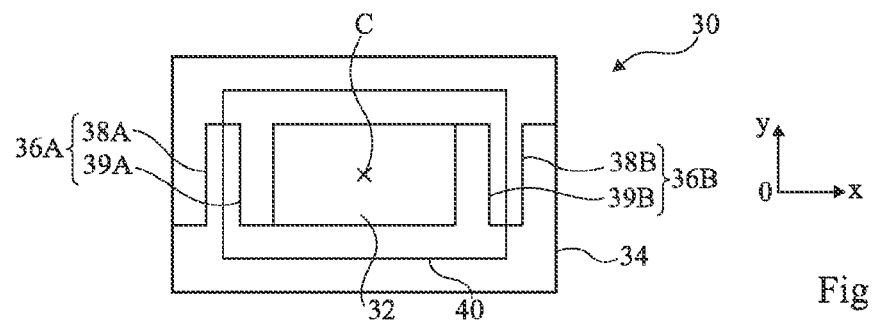
FIG. 2 is a functional diagram of an embodiment of a spring-mass system.

FIG. 2 shows a functional diagram of an embodiment of a spring-mass system 30, particularly capable of being used to form a vibration energy recovery device. Spring-mass system 30 comprises a mobile mass 32 connected by a number "a" of springs 36A, 36B to a support 34, schematically shown by a framing in FIG. 2. Springs 36A, 36B are capable of enabling mobile mass 32 to move along direction (Ox) with respect to support 34 in operation. Number "a" of springs 36A, 36B is greater than or equal to 2. In the embodiment shown in FIG. 2, "a" is equal to 2. In the following description, identical elements associated with the two springs 36A, 36B are designated by the same number followed by suffix "A" when this element is associated with spring 36A located to the left of mobile mass 32 in FIG. 2 and with suffix "B" when this element is associated with spring 36B located to the right of mobile mass 32 in FIG. 2.

Each spring 36A or 36B comprises at least the series connection of a number "n" of beams 38A, 39A or 38B, 39B. Number "n" of beams 38A, 39A or 38B, 39B is greater than or equal to 2. In the embodiment shown in FIG. 2, "n" is equal to 2. Call (Oy) the direction perpendicular to direction (Ox) and (Oz), not shown in FIG. 2, the direction perpendicular to directions (Ox) and (Oy). As an example, direction (Oz) is vertical and plane (Oxy) is a horizontal plane. Beams 38A, 38B, 39A, 39B forming springs 36A, 36B extend parallel to direction (Oy) in the absence of a deformation.

Spring-mass system 30 further comprises a stiffening frame 40 formed of a ring-shaped part which totally surrounds mobile mass 32, at a distance from mobile mass 32 and support 34. Stiffening frame 40 is attached to springs 36A, 36B. More specifically, first beam 38A, 38B comprises an end attached to support 34 and an opposite end attached to stiffening frame 40. Second beam 39A, 39B comprises an end attached to stiffening frame 40 and an opposite end attached to mobile mass 32. Stiffening frame 40 displaces along direction (Ox) when mobile mass 32 displaces along direction (Ox). Stiffening frame 40 does not substantially deform in operation.

Spring-mass system 30 comprises an axis of symmetry C parallel to direction (Oz), shown by a point in FIG. 2. Spring 36A corresponds to the symmetrical of spring 36B according to the orthogonal space symmetry with respect to axis C. Stiffening frame 40 has a symmetrical structure according to the orthogonal symmetry with respect to axis C. By definition, the orthogonal symmetry with respect to axis C is the space transformation which, to each point M which is not located on axis C, associates point M' such that C is the perpendicular bisector of segment [MM'].

The inventors have shown by simulation that the significant displacement along direction (Oz) of spring-mass system 10 for a resonance frequency smaller than 50 Hz is partly due to the twisting of the beams forming springs 20, particularly due to the increase of the weight of mobile mass 18 and to the thinness, along direction (Ox), of the beams forming elementary springs 20. In spring-mass system 30 according to the present embodiment, stiffening frame 40 enables to limit the twisting of beams 38A, 38B, 39A, 39B of springs 36A, 36B. The displacement along direction (Oz) of mobile mass 32 is then decreased. More specifically, frame 40 enables to prevent for the areas of springs 36A, 36B to which it is attached to have a rotation along a rotation axis parallel to direction (Oy) and finally to have beams 38A, 39A or 38B, 39B which tend to displace along direction (Oz).

Figure 3:
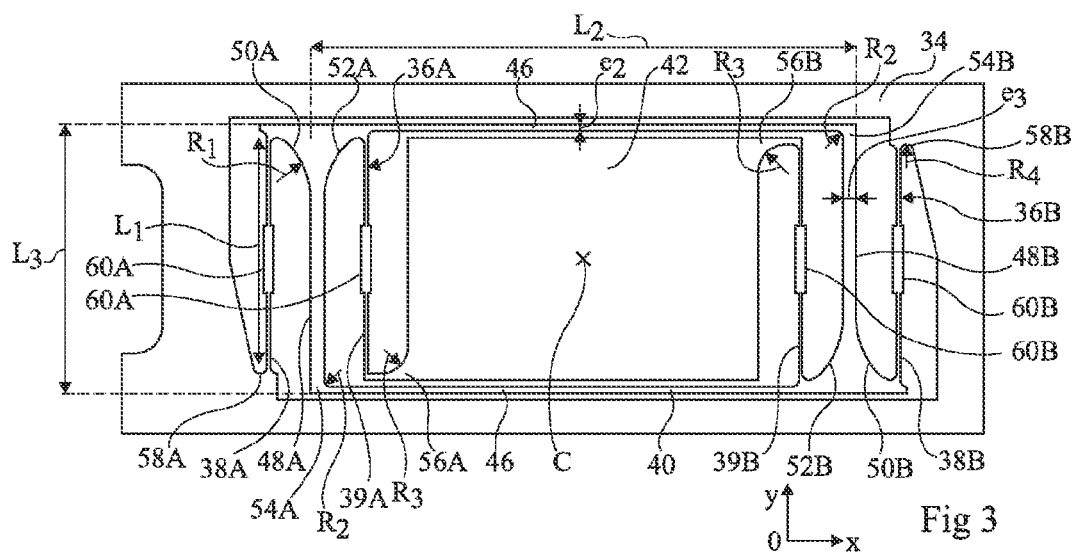
FIGS. 3 and 4 respectively are a cross-section view and a perspective view of an embodiment of a spring-mass system according to the functional diagram of FIG. 2.
Figure 4:
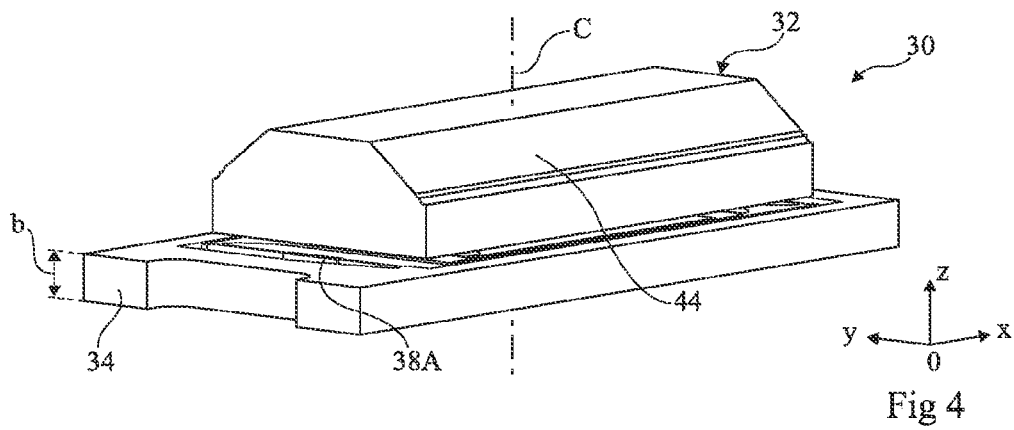

FIGS. 3 and 4 respectively are a cross-section view and a perspective view of a more detailed embodiment of spring-mass system 30 according to the functional diagram of FIG. 2. The cross-section plane of FIG. 3 is parallel to plane (Oxy).

In this embodiment, springs 36A, 36B, support 34, stiffening frame 40, and a portion 42 of mobile mass 32 form part of a monolithic part formed by cutting and/or etching of a plate having a thickness H, for example, a plate made of a semiconductor material, particularly silicon, a metal plate, particularly made of aluminum, of steel, or of tungsten, a plastic plate, or a ceramic plate. As a variation, the monolithic part may be formed by molding.

Mobile mass 32 comprises first portion 42 of the plate where springs 36A, 36B, support 34, and stiffening frame 40 of spring-mass system 30 are formed and a second portion 44, shown in FIG. 4, attached to first portion 42, for example by gluing, and capable of being made of a material different from that of first portion 42. As an example, second portion 44 is made of tungsten.

FIG. 5 is a detail cross-section view of beam 38B. The other beams 38A, 39B, and 39A may have the same structure as beam 38B.

Each beam 38A, 38B, 39A, 39B has a length $L_1$ measured along direction (Oy). As an example, beams 38A, 38B, 39A, 39B have a rectangular cross-section having a width $e_1$ measured along direction (Ox) and a height b measured along direction (Oz) and shown in FIG. 4.

In the present embodiment, stiffening frame 40 has a rectangular general shape and comprises two elongated branches 46 oriented parallel to direction (Ox), having a length $L_2$ measured along direction (Ox) and a width $e_2$ measured along direction (Oy), and two elongated branches 48A, 48B oriented parallel to direction (Oy), having a length $L_3$ measured along direction (Oy) and a width $e_3$ measured along direction (Ox). Lengths $L_2$ and $L_3$ particularly depend on the dimensions of portion 42 of mobile mass 32 and on the displacement of mobile mass 32 along direction (Ox).

Each branch 48A, 48B of stiffening frame 40 is connected to beam 38A, 38B by a rounded portion 50A, 50B and to beam 39A, 39B by a rounded portion 52A, 52B, each rounded portion 50A, 50B, 52A, 52B having a radius of curvature $R_1$. On the side opposite to the connection between branch 48A, 48B and beams 38A, 38B, 39A, 39B, branch 48A, 48B is connected to branch 46 by a rounded portion 54A, 54B having a radius of curvature $R_2$.

Each beam 39A, 39B is connected to portion 42 of mobile mass 32 by a rounded portion 56A, 56B having a radius of curvature $R_3$. Each beam 38A, 38B is connected to support 34 by a rounded portion 58A, 58B having a radius of curvature $R_4$.

As shown in FIG. 5, each beam 38A, 38B, 39A, 39B may comprise a reinforced portion 60A, 60B, for example, substantially located in the median portion, having a length $L_4$ and a width $e_4$ strictly greater than $e_1$.

Calling E the Young's modulus of the material forming springs 36A, 36B, spring constant $k_e$ of each beam 38A, 38B, 39A, 39B is provided by the following relation (1):

$$k_e = \frac{E \cdot b \cdot e_1^3}{L_1^3} \qquad (1)$$

Stiffness $k_T$ of the general spring-mass system 30 is provided by the following relation (2):

$$k_T = \frac{a}{n} k_e = \frac{a}{n} \frac{E \cdot b \cdot e_1^3}{L_1^3} \qquad (2)$$

To obtain the desired resonance frequency $f_0$ of spring-mass system 30, length $L_1$ and width $e_1$ should respect the following relation (3):

$$\frac{L_1}{e_1} = \left( \frac{a}{n} \frac{E \cdot b}{m(2\pi \cdot f_0^2)} \right)^{3/2} \qquad (3)$$

The displacement of mobile mass 32 along direction (Oz) is smaller than a few micrometers while the displacement of mobile mass 32 along direction (Ox) may be greater than a few millimeters, particularly for a static acceleration level around 9.81 m·s$^{-2}$ along direction (Oz) or (Ox). This structure enables to achieve a stiffness along direction (Oz) which can be up to 100 times greater than the stiffness along direction (Ox).

Examples of dimensions in the case where springs 36A, 36B, support 34, stiffening frame 40, and portion 42 of mobile mass 32 correspond to a monolithic part formed by etching of a plate of a semiconductor material, particularly silicon which has a 130-GPa Young's modulus, and providing a resonance frequency smaller than or equal to 20 Hz, are the following:

mass of mobile mass 32: greater than or equal to 1 g, for example, approximately 1.36 g;

length $L_1$: greater than or equal to 1 mm, preferably greater than or equal to 2 mm, more preferably greater than or equal to 3 mm, for example, approximately 4 mm;

width $e_1$: smaller than or equal to 50 μm, preferably smaller than or equal to 30 μm, more preferably smaller than or equal to 25 μm, for example, approximately 22 μm;

height b: greater than or equal to 300 μm, preferably greater than or equal to 500 μm, more preferably greater than or equal to 600 μm, for example, approximately 700 μm;

length $L_2$: greater than or equal to 5 mm, preferably greater than 8 mm, for example, 8.5 mm;

widths $e_2$, $e_3$: in the range from 0.1 to 100 times $e_1$, preferably from 5 to 10 times $e_1$, for example approximately 0.2 mm;

length $L_3$: close to $L_1$, preferably greater than $L_1$ by from 100 μm to 500 μm, for example, greater than $L_1$ by 350 μm;

width $e_3$: approximately 0.2 mm;

length $L_4$: greater than or equal to $L_1/5$, for example, approximately $L_1/4$;

width $e_4$: greater than or equal to $2*e_1$, preferably greater than or equal to $3*e_1$, for example, approximately 0.06 mm;

radius of curvature $R_1$: greater than or equal to 0.1 mm, preferably greater than 1 mm, for example, approximately 1.5 mm;

radius of curvature $R_2$: greater than or equal to 0.1 mm;

radius of curvature $R_3$: greater than or equal to 0.1 mm, preferably greater than or equal to 0.2 mm, more preferably greater than or equal to 0.5 mm; and radius of curvature $R_4$: greater than or equal to $10*e_1$.

Closed stiffening frame 40 limits the twisting of beams 38A, 38B, 39A, 39B around axis (Oy). This enables to limit the sinking of mobile mass 32 along direction (Oz) under its own weight. Stiffening portions 60A, 60B also contribute to preventing the twisting of beams 38A, 38B, 39A, 39B around axis (Oy), but by a lesser extent than stiffening frame 40.

The presence of stiffening frame 40 and of stiffening portions 60A, 60B only very slightly modifies resonance frequency $f_0$ of spring-mass system 30, for example, from 5 to 10%.

FIG. 6 shows a functional diagram of another embodiment of spring-mass system 65, where the number of springs "a" is doubled with respect to spring-mass system 30 shown in FIG. 2. In addition to springs 36A, 36B, spring-mass system 65 comprises two additional springs 66A, 66B which are symmetrical to each other with respect to axis C. Further, in the shown example, spring 36A is symmetrical to spring 66B with respect to a plane parallel to plane (0yz) containing axis C, and spring 66A is symmetrical to spring 36B with respect to this plane. Each spring 66A, 66B comprises a succession of a first beam 67A, 67B and of a second beam 68A, 68B. Stiffening frame 40 is attached to springs 36A, 36B, as previously described, and, further, to springs 66A, 66B. More specifically, beam 67A, 67B comprises an end attached to support 34 and an opposite end attached to stiffening frame 40. Second beam 68A, 68B comprises an end attached to stiffening frame 40 and an opposite end attached to mobile mass 32. Stiffness $k_T$ of spring-mass system 65 is greater than the stiffness of spring-mass system 30 for the same bulk. It may be calculated by using relation (2), taking "a" equal to 4 and "n" equal to 2. Such a configuration enables to limit the sinking of the mobile mass even more than the configuration shown in FIG. 3. More specifically, this configuration does not enable to increase the ratio between the stiffness along directions (Oz) and (Ox), given that the two stiffness are increased by the same order of magnitude. However, it enables to limit the rotation of seismic mass 32 along an axis parallel to direction (Ox).

FIG. 7 shows a functional diagram of another embodiment of a spring-mass system 70 where the number of springs "a" is equal to 2 and number "n" of beams per spring is equal to 4. As compared with the spring-mass system 30 shown in FIG. 2, spring-mass system 70 further comprises, for each spring 36A, 36B, two additional beams 71A, 71B, 72A, 72B. Further, spring-mass system 70 comprises two additional stiffening frames 74, 76 in addition to stiffening frame 40. Each frame 40, 74, 76 corresponds to a closed frame totally surrounding mobile mass 32 and attached to springs 36A, 36B. Stiffening frame 40 is attached to beams 38A, 38B, 39A, 39B, as previously described. However, conversely to spring-mass system 30, beam 39A, 39B, instead of being attached to mobile mass 32, is attached to stiffening frame 74. Beam 71A, 71B comprises an end attached to stiffening frame 74 and an opposite end attached to stiffening frame 76. Beam 72A, 72B comprises an end attached to stiffening frame 76 and an opposite end attached to mobile mass 32. Stiffness $k_T$ of spring-mass system 70 is smaller than the stiffness of spring-mass system 30 for the same bulk. The stiffness can be deduced from relation (2) with "a" equal to 2 and "n" equal to 4. Such a configuration enables to decrease the mechanical stress in the material forming the beams, for a given displacement and surface area, or to increase the displacement of the mobile mass for a given maximum mechanical stress.

FIG. 8 shows a functional diagram of another embodiment of a spring-mass system 80 where the number of springs "a" is equal to 4 and the number of beams per spring "n" is equal to 4. Spring-mass system 80 thus corresponds to the combination of the characteristics of spring-mass system 60 and of spring-mass system 70.

Stiffness $k_T$ of spring-mass system 80 is greater than the stiffness of spring-mass system 30 for a given bulk. However, the displacement along direction (Ox) capable of being obtained with spring-mass system 80 is greater than that which can be obtained with spring-mass system 30 for a maximum mechanical stress in the material forming the beam.

Figure 9:
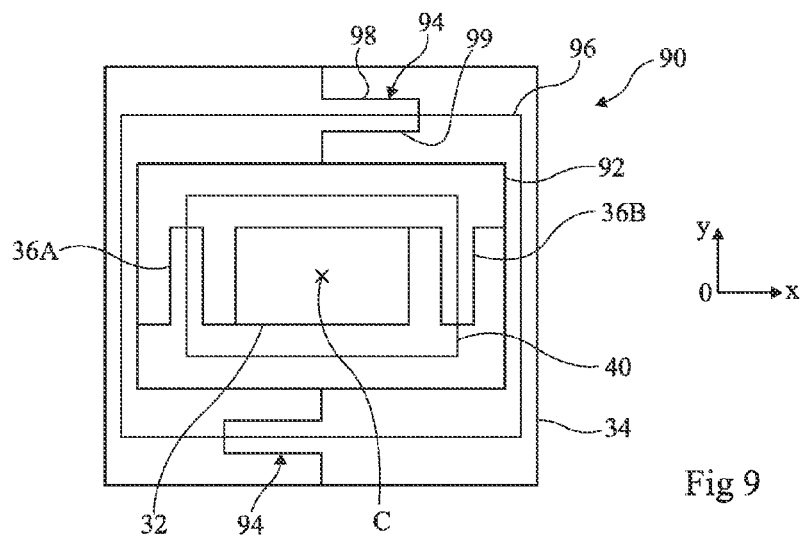

FIG. 9 shows a functional diagram of another embodiment of a spring-mass system 90 which allows a displacement of mobile mass 32 both along direction (Ox) and direction (Oy).

For this purpose, as compared with spring-mass system 30 shown in FIG. 2, beams 37A, 37B are not attached to support 34 but to a closed intermediate frame 92 which totally surrounds stiffening frame 40. Intermediate frame 92 is connected to support 34 by at least two springs 94. Springs 94 allow a displacement of mobile mass 32 along direction (Oy). Springs 94 comply with the same constraints as springs 36A, 36B. In particular, they are symmetrical to each other by orthogonal symmetry with respect to axis C. Further, an additional closed stiffening frame 96 totally surrounding intermediate frame 92 and attached to springs 94 is provided. More specifically, each spring 94 is formed of at least two beams 98, 99 extending parallel to direction (Ox) in the absence of a deformation. Beam 98 comprises an end attached to support 34 and an opposite end attached to stiffening frame 96. Beam 99 comprises an end attached to stiffening frame 96 and an opposite end attached to intermediate frame 96.

In the previously-described embodiments, the mean curve followed by stiffening frame 40 has, in top view, a rectangular general shape. However, other shapes of mean curves may be used.

Figure 10:
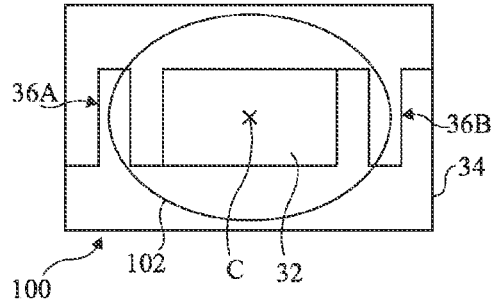
Figure 11:
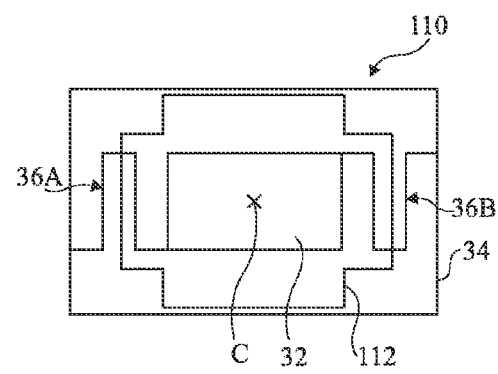

FIGS. 10 and 11 each show a functional diagram of another embodiment of a spring-mass system 100 where stiffening frame 40 of spring-mass system 30 of FIG. 2 is replaced with a stiffening frame 102 which follows a mean closed curve in the shape of an ellipse (FIG. 10) or of a broken line (FIG. 11). Other shapes, such as a circle, may be used.

In the previously-described embodiments, each beam 38A, 38B, 39A, 39B corresponds to a straight beam extending along direction (Oy) in the absence of a deformation. However, other arrangements of straight beams may be used.

Figure 12:
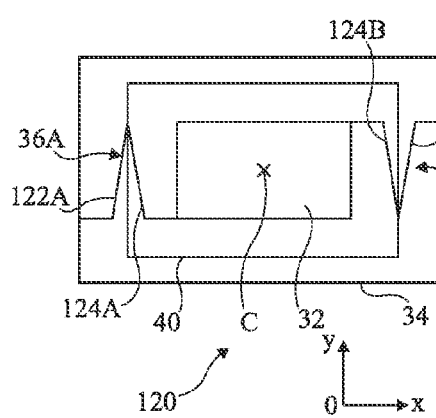

FIG. 12 shows an embodiment of a spring-mass system 120 where beams 38A, 38B, 39A, 39B of spring-mass system 30 shown in FIG. 2 are replaced with beams 122A, 122B, 124A, 124B, each corresponding to a straight beam inclined with respect to directions (Oy) and (Ox). Each pair of beams 122A, 124A and 122B, 124B forms a "V".

In the previously-described embodiments, each beam 38A, 38B, 39A, 39B corresponds to a straight beam. However, other types of straight beams may be used.

Figure 13:
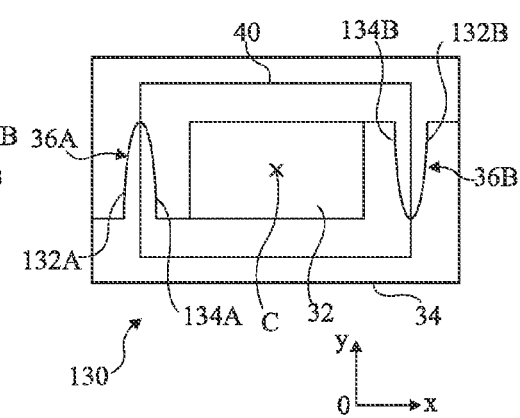

FIG. 13 shows an embodiment of a spring-mass system 130 where beams 38A, 38B, 39A, 39B of spring-mass system 30 shown in FIG. 2 are replaced with beams 132A, 132B, 134A, 134B, each corresponding to a beam having a mean curve which is not a straight line.

Various embodiments with different variations have been described here above. It should be noted that those skilled in the art may combine various elements of these various embodiments and variations without showing any inventive step. In particular, the embodiment shown in FIG. 9 may be implemented with any of the embodiments described in relation with FIGS. 2, 6 to 8 and 10 to 13. Further, the embodiment shown in FIG. 10 or 11 may be implemented with any of the embodiments described in relation with FIGS. 2, 6 to 9, 12 and 13. Further, the embodiment shown in FIG. 12 or 13 may be implemented with any of the embodiments described in relation with FIGS. 2 and 6 to 11.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A spring-mass system (30) comprising:
a support (34);
a mass (32) mobile with respect to the support;
at least one first and one second spring (36A, 36B) connecting the mass to the support and allowing a displacement of the mass relative to the support along a first direction (Ox), the first spring being the symmetrical of the second spring with respect to an axis (C), each first and second spring comprising at least first and second series-connected beams (38A, 38B, 39A, 39B) arranged in zigzag; and
a first closed frame (40) surrounding the mass, at a distance from the mass and the support, each first beam (38A, 38B) having a first end connected to the support and a second end attached to the first frame, and each second beam (39A, 39B) having a third end attached to the first frame and a fourth end connected to the mass.

2. The spring-mass system of claim 1, wherein at least one of the first and second beams (38A, 38B, 39A, 39B) comprises a bulge (60A, 60B) in its median portion.

3. The spring-mass system of claim 1, wherein the length ($L_1$) of each first and second beam (38A, 38B, 39A, 39B) is greater than or equal to 1 mm.

4. The spring-mass system of claim 1, wherein the height of each first and second beam (38A, 38B, 39A, 39B) measured parallel to the axis of symmetry (C) is greater than or equal to 300 µm.

5. The spring-mass system of claim 3, wherein the width ($e_1$) of each first and second beam (38A, 38B, 39A, 39B) measured perpendicularly to the length in a plane perpendicular to the axis of symmetry is smaller than or equal to 100 µm.

6. The spring-mass system of claim 5, wherein the first frame (40) is connected to each first and second beam (38A, 38B, 39A, 39B) by a first rounded portion (50A, 52A, 50B, 52B) having a radius of curvature ($R_1$) greater than or equal to ten times said width ($e_1$).

7. The spring-mass system of claim 5, wherein the second beam (39A, 39B) is connected to the mass (32) by a second rounded portion (56A, 56B) having a radius of curvature ($R_3$) greater than or equal to ten times said width ($e_1$).

8. The spring-mass system of claim 1, comprising at least one third and one fourth spring (66A, 66B) connecting the mass (32) to the support (34) and allowing a displacement of the mass with respect to the support along the first direction (Ox), the third spring being the symmetrical of the fourth spring with respect to said axis (C), each third and fourth spring comprising at least third and fourth series-connected beams (67A, 67B, 68A, 68B) arranged in zigzag, each third beam comprising a third end connected to the support and a fourth end attached to the first frame and each fourth beam comprising a fifth end attached to the first frame and a sixth end connected to the mass.

9. The spring-mass system of claim 1, comprising, for each first and second spring (36A, 36B), at least one fifth beam (71A, 71B) in series with the second beam (39A, 39B) and in zigzag with the second beam, and a second closed frame (74) surrounding the mass (32), at a distance from the mass and the support (34), the fourth end of each second beam (39A, 39B) being attached to the second frame (74) and each fifth beam (71A, 71B) comprising a seventh end attached to the second frame and an eighth end connected to the mass.

10. The spring-mass system of claim 9, comprising, for each first and second spring (36A, 36B), at least one sixth beam (72A, 72B) in series with the fifth beam (71A, 71B) and in zigzag with the fifth beam, and a third closed frame (76) surrounding the mass (32), at a distance from the mass and the support (34), the eighth end of each fifth beam being attached to the third frame and each sixth beam (72A, 72B) comprising a ninth end attached to the third frame and a tenth end connected to the mass.

11. The spring-mass system of claim 1, wherein the first frame follows a closed curve selected from the group comprising a rectangle, a circle, an ellipse, and a closed broken line.

12. An energy recovery device comprising the spring-mass system (30) of claim 1.

13. A seismometer comprising the spring-mass system (30) of claim 1.

14. An accelerometer comprising the spring-mass system (30) of claim 1.

15. An inclinometer comprising the spring-mass system (30) of claim 1.

16. A magnetometer comprising the spring-mass system (30) of claim 1 and wherein at least a portion of the mass (32) is formed of a ferromagnetic material and/or of a permanent magnet.

17. A force and/or displacement sensor comprising the spring-mass system (30) of claim 1.

* * * * *